(12) United States Patent
Pozder et al.

(10) Patent No.: US 6,420,208 B1
(45) Date of Patent: Jul. 16, 2002

(54) METHOD OF FORMING AN ALTERNATIVE GROUND CONTACT FOR A SEMICONDUCTOR DIE

(75) Inventors: Scott K. Pozder; Harold A. Downey; Thomas S. Kobayashi, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 23 days.

(21) Appl. No.: 09/662,079

(22) Filed: Sep. 14, 2000

(51) Int. Cl.[7] ............................................... H01L 21/44
(52) U.S. Cl. ...................... 438/106; 438/106; 257/738
(58) Field of Search .................. 438/106, 119, 438/118, 611–617; 257/738, 778, 779, 774

(56) References Cited

U.S. PATENT DOCUMENTS 5,977,633 A * 11/1999 Suzuki et al. ............... 257/738

* cited by examiner

*Primary Examiner*—Hoai V. Ho
*Assistant Examiner*—Dung Anh Le
(74) *Attorney, Agent, or Firm*—James L. Clingan, Jr.

(57) ABSTRACT

In a semiconductor device, a method forms an alternative ground contact for a semiconductor die in which bulk silicon at the back of a die may be electrically grounded to an area containing functional devices and/or to packaging substrate by conductive fillet material surrounding the die and in contact with the bulk silicon and with a guard ring surrounding the area containing functional devices and/or the packaging substrate.

20 Claims, 3 Drawing Sheets

METHOD OF FORMING AN ALTERNATIVE GROUND CONTACT FOR A SEMICONDUCTOR DIE

FIELD OF THE INVENTION

The invention relates generally to integrated circuits and more particularly to a substrate to die interface used in assembled integrated circuits.

BACKGROUND OF THE INVENTION

Integrated circuits are formed on semiconductor substrates (wafers) using a number of different processing operations that create the circuit elements. The circuit elements consist of transistors, resistors, capacitors, interconnects, and other functional structures. In practice, multiple die, circuit arrays for a specific function, are formed on a semiconductor substrate and are cut (scribed or sawn) from the substrate to form single die ready for attachment to a package or other interface. Access to the die circuitry is made from the package or interface contacts to bond pads formed on the final metal layer of the die. Bond pads provide the means for transfer of electrical signals and power from and to the die via bonding wires, conductive bumps, etc., connected to the package or interface substrate. The package or wiring board substrate (direct chip- attach to board, or multi-die package substrate) is the connection between the die and other circuits. In the case of flip chip packaging the die has metal balls formed on the bond pads and is flipped onto complementing bond pads of the package substrate. Thermal processing of the die/package sandwich completes the contact. The electrically conductive balls and an under-fill adhesive applied between the die and package substrate provide adherence of the die to the package. In addition, an adhesive fillet is applied to the sides of the die to add to the robustness of the die to package substrate attach.

A problem with cost and complexity arises when a backside ground contact is needed for a flip chip packaged die. The backside electrical ground connects the backside of the wafer to a common electrical potential, the ground potential, which is generally considered to be the null reference potential. In the case of silicon on insulator (SOI) semiconductor substrates, the silicon where the transistors are made is separated from the backside of the substrate by a layer of buried oxide. Conventionally, to form a ground contact to the backside, interconnects are added to connect to via openings through the silicon and buried oxide to the backside in eac[0088] die. The formation of this contact requires additional processing of at least one mask-layer and an etch step. In-package solutions include attachment of a grounded heat sink or deposition of a metal film on the backside that is wire bonded to a ground contact, each of which require additional processing and hardware costs.

In order to realize minimum complexity the present disclosure provides an alternative ground contact for packaged die. Conventionally, the die is formed when the wafer is sawn into pieces along the scribe street. The edge of the kerf from this cut forms the die edge which is normally covered by non-conductive fillet material after the die is mounted in the package. The present invention uses a conductive fillet that contacts the side of the sawn die, the ground pad on the package substrate, and/or the metal from the edge seal exposed at the sawn edge of the die. The edge seal is an existing interconnect feature that parallels the perimeter of the die at all levels such that it forms a barrier on the edge of the die. As disclosed herein, in order to provide an electrical ground for the back contact, the edge seal has metal fingers or interconnected tiles extending from every metal layer into the saw street such that the saw process exposes this metal. In addition, a row of metal pads or a line(s) that lies, at or just outside the perimeter of the attached die maybe added to the package substrate to provide an electrical ground for the backside fillet contact. Connection to the backside silicon, the exposed edge seal fingers, and/or the package perimeter contact is made by an electrically conductive fillet material, such as metal filled epoxy, for example. The conductive fillet material replaces the standard nonconductive fillet material typically used in die packaging.

The advantages of this alternative method of forming a ground contact is that no special wafer processing is necessary, no additional interconnects are needed, and process induced gate damage by differential charging of the backside of the wafer is eliminated. Fillet contact to the edge of the bulk silicon is sufficient to allow electric charge to bleed off without additional processing. All steps are standard except for the substitution of fillet material and a minor mask change at the metal levels. The grounded fillet around the perimeter of the die also forms a partial radiofrequency (RF) shield that can be made complete by attachment of a heat sink and the addition of ground planes to the package substrate.

An additional benefit of the structure described herein is the removal of heat from the die laterally using the edge seal and the fillet contact. Metal interconnects and ground lines or planes connected to the edge seal would conduct heat to a thermally as well as electrically conductive fillet. The fillet heat sink also provides an additional conduction path from the fillet to an external heat sink thus increasing the ability to remove heat.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
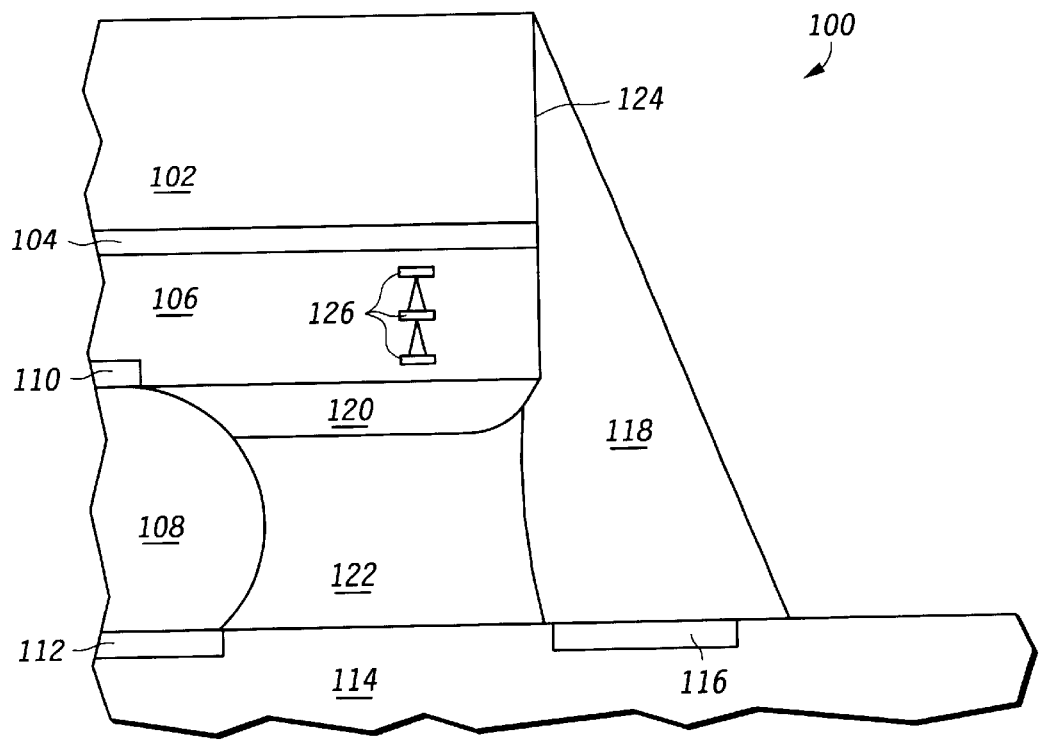
FIG. 1 is a cross section of a semiconductor device that utilizes a conductive fillet to ground the bulk silicon to the substrate.

Shown in FIG. 1 is an embodiment of the present invention in which a semiconductor device 100 utilizes a conductive fillet 118 to provide an electrical ground contact for the bulk silicon 102 to the substrate 114 through contact with a substrate contact pad 116. A typical semiconductor device as shown includes a bulk silicon substrate 102 and optionally a buried oxide layer 104 that separates the functional device area 106 from the bulk silicon 102. The functional device area 106 may include any functional device, circuit or combination of functional devices and circuits and would include, but is not limited to transistors, inductors, resistors, and capacitors. Such circuits may include active or passive devices and combinations thereof. The functional device area also includes an edge seal 126 near the edge 124 of the die. This guard ring or edge seal 126 may be continuous and typically surrounds the entire die or functional device area 106. The edge seal or guard ring 126 is made of stacked continuous bands or rings of metal that are formed on every metal and via layer of the functional device area. Although only 3 metal rings are shown in the Figures, it is understood that functional devices may include fewer metal layers, or they may include many more metal layers, and that edge seals containing any number of metal rings would be included within the scope and content of the presently claimed invention.

Also shown in the device in FIG. 1 is a solder bump interconnect 108 that provides a standard electrical connection between the die and the substrate through an interconnect bond pad 110 in the die and a packaging bond pad 112 on the packaging substrate as shown. Further details of the device shown are a polyimide layer 120 and the under-fill which may be an epoxy under-fill 122. As shown in the embodiment in FIG. 1, an electrical ground contact is provided to the bulk silicon 102 by a layer of conductive fillet 118 which contacts the edge 124 of the die and also contacts the substrate 114 through the substrate contact pad 116. The conductive fillet or metal epoxy fillet 118 provides an electrical ground path for the bulk silicon.

Figure 2:
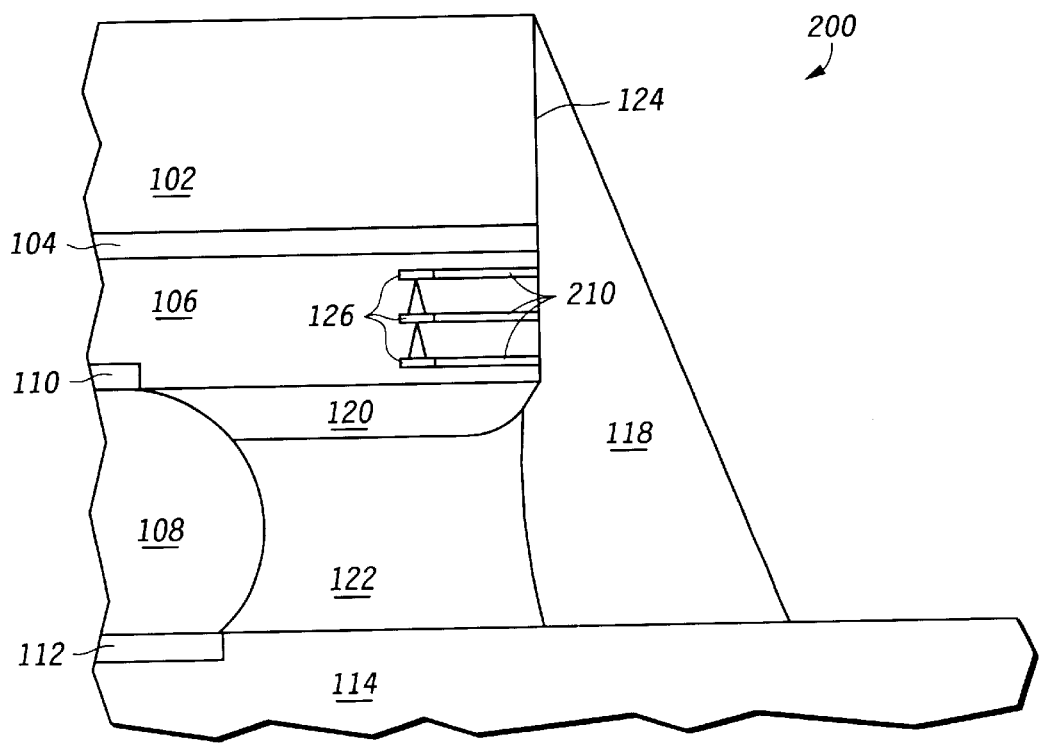
FIG. 2 is a cross section of a semiconductor device that utilizes a conductive fillet to ground the bulk silicon to the guard ring through metal fingers.

An alternative embodiment of a silicon device 200 is shown in FIG. 2. In the device shown, metal fingers 210 extend from and are electrically connected to the guard ring 126. These fingers extend past the edge 124 of the die so that the ends of the fingers are exposed when the wafer is separated into die by various techniques used in the art including being scribed and sawn, for example. As shown in FIG. 2, the metal fingers provide an electrical contact to the conductive fillet 118, thereby providing an electrical ground path for the bulk silicon 102. It is also understood that the conductive fillet as shown in FIG. 2 may provide a path for a heat sink to remove heat from the functional device area 106.

Figure 3:
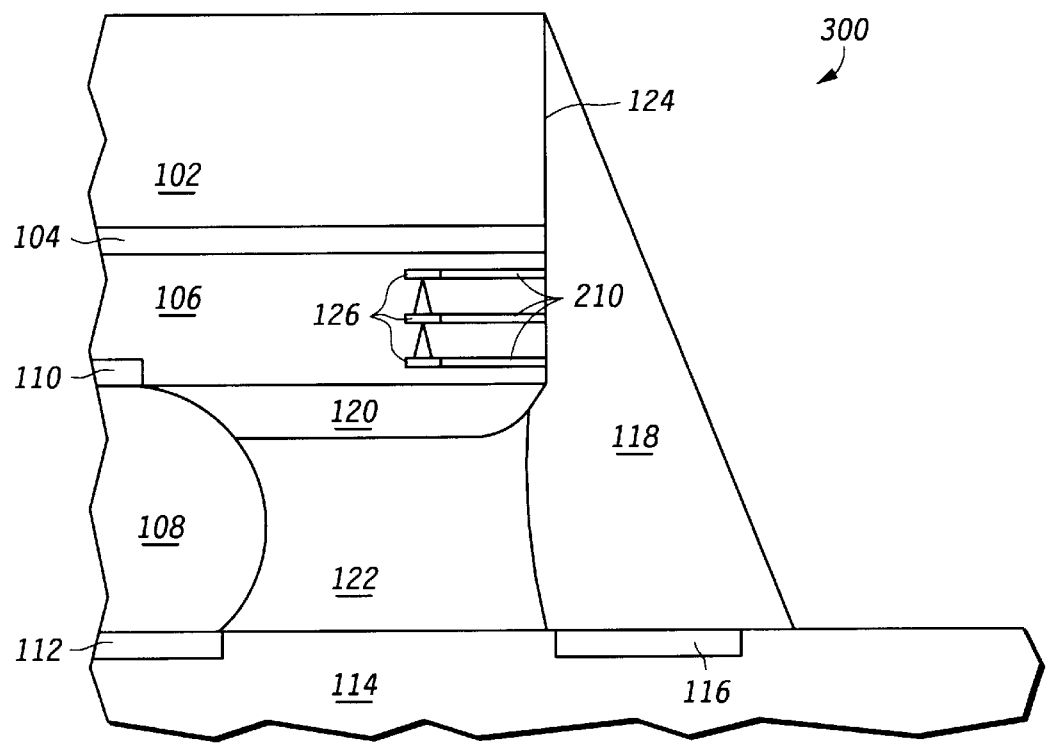
FIG. 3 is a cross section of a semiconductor device that utilizes a conductive fillet to ground the bulk silicon to the substrate and to the guard ring.

A further embodiment of the invention 300 is shown in FIG. 3. In this embodiment the ground path from the bulk silicon 124 that passes through the conductive fillet contacts both the metal fingers 210 that interconnect to the guard ring 126 and also contacts the substrate contact pad 116, thus providing assurance that all three areas of the device have a common electrical potential.

Figure 4:
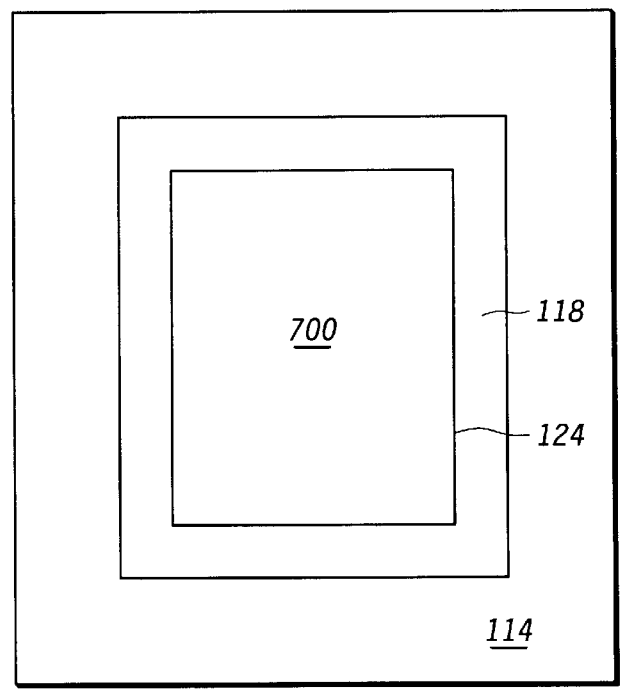
FIG. 4 is a schematic representation in top view of a packaged die.

A top view of a semiconductor device is shown in FIG. 4. In this view the die 700, is shown to be mounted on substrate 114 and the side of the die is connected to the package substrate by the conductive fillet 118, which completely surrounds the die 700. The die 700 is also completely surrounded by the guard ring (not shown) that is near the edge 124. In a typical manufacturing process, the substrate is scribed and sawn along a saw street that separates and defines the individual die. In conventional processing, the area from the sawn die edge to the package substrate is filled with a non-conductive fillet. In the practice of the present invention, however, a conductive fillet 118 is formed in contact with the edge 124 of the die 700 to form an electrical ground path connection from the bulk silicon to the substrate 114, to the guard ring 126, or to both the substrate 114 and the guard ring 126.

Figure 5:
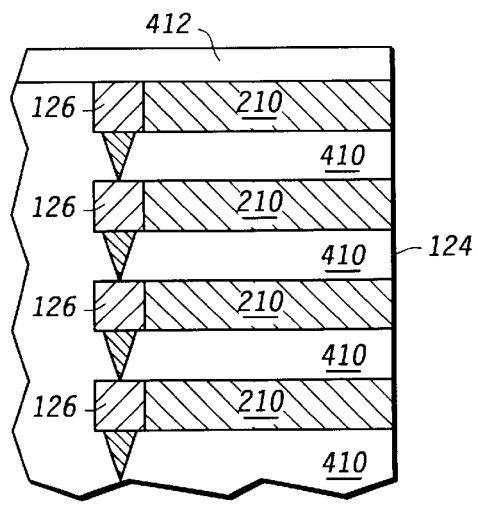
FIG. 5 is a cross section of a semiconductor device that illustrates the interconnection of the guard ring and the metal fingers.
Figure 6:
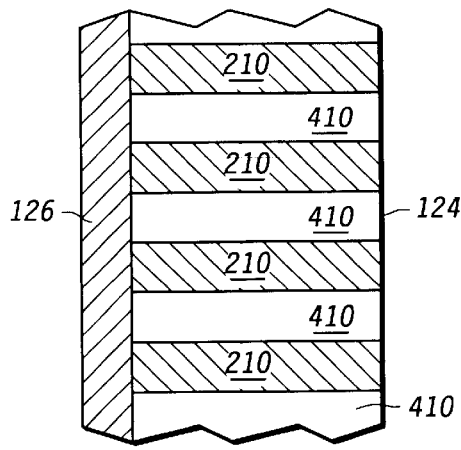
FIG. 6 is a top view of the guard ring and metal fingers shown in FIG. 5.

FIG. 5 provides a cross-sectional view of the edge seal or ring guard elements 126 and the metal fingers 210 that extend to the edge 124 of the die. The metal fingers are separated by alternating layers of an oxide or dielectric material 410. In a typical embodiment, a passivation layer 412 seals the top of the die and prevents moisture or ionic contamination of the device. As shown in FIG. 6 in top view, the edge seal or guard ring 126 is a continuous stacked metal band around the die, and would extend around the entire perimeter 124 as shown in FIG. 4. In certain embodiments the guard ring 126 is connected along its entire length to the edge 124 by a plurality of metal fingers 210 separated by dielectric material 410. Although the metal fingers are shown as being evenly or uniformly spaced along the guard ring 126, it is understood that the spacing may also be non-uniform, or discontinuous such that certain areas of the die contain connections and some areas do not, as required by individual die components.

Figure 7:
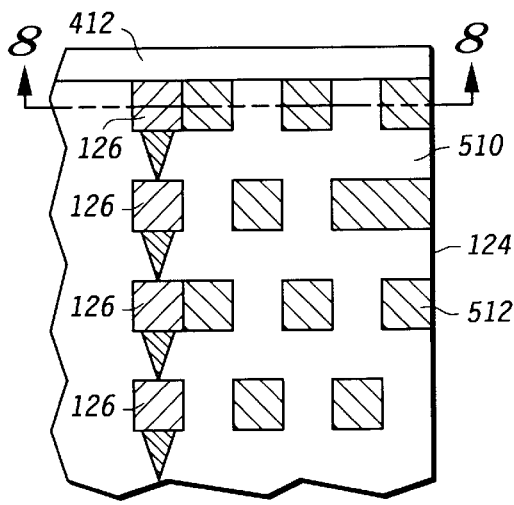
FIG. 7 is a schematic side view of an embodiment in which metal sheets connect the guard ring to the sawn edge of the die.
Figure 8:
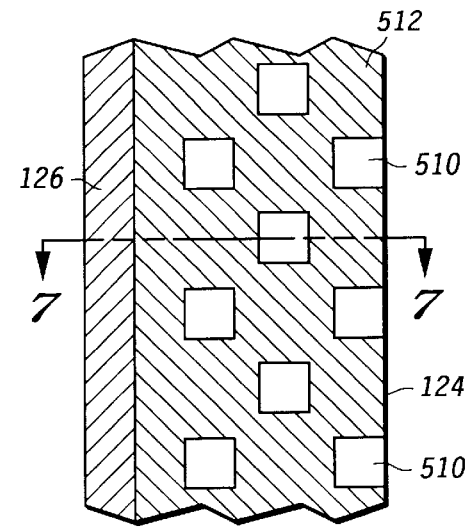
FIG. 8 is a top view of the embodiment shown in FIG. 7.
Figure 9:
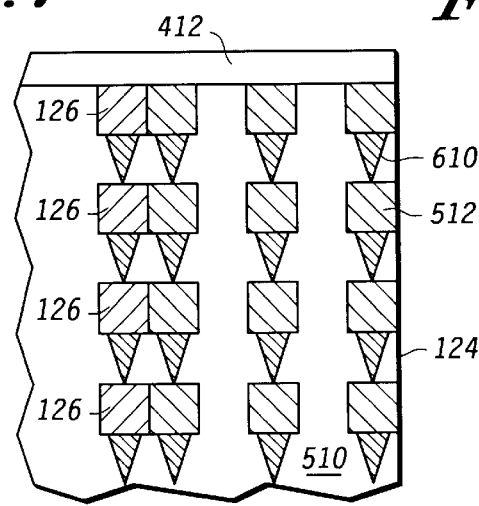
FIG. 9 is a side view of the embodiment shown in FIG. 7, in which interconnects between metal sheets are shown.

An alternative embodiment of the edge seal interconnection is shown in FIGS. 7 and 8. In the embodiment shown in these figures, stacked metal sheets 512 connect the guard ring 126 with the edge 124 of the die. In order to facilitate the chemical mechanical polish of the metal sheets, dielectric tiles 510 are interspaced in the metal sheets 512. This is shown in top view in FIG. 8 and in cross-sectional view in FIG. 7. As shown in FIG. 9, the metal sheets 512 are interconnected between layers by metal vias 610. Although not shown, it is understood that the metal fingers may also be interconnected by vias.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a semiconductor device, comprising:

providing a semiconductor die, wherein the die includes bulk silicon, functional devices, and metal interconnects and wherein the die includes guard rings surrounding the silicon functional devices;

providing a substrate electrically connected to the die through a plurality of electrical contacts; and forming an electrical ground path for the bulk silicon wherein the electrical ground path comprises conductive fillet material.

2. The method of claim 1, wherein the conductive fillet material comprises a conductive epoxy, ceramic, or polymeric material.

3. The method of claim 1, wherein the bulk silicon is electrically grounded to the substrate.

4. The method of claim 1, wherein the bulk silicon is electrically grounded to the guard rings.

5. The method of claim 1, wherein the bulk silicon is electrically grounded to the substrate and the guard rings.

6. The method of claim 1, wherein the substrate is a packaging substrate.

7. The method of claim 1, wherein the substrate is a wiring board.

8. The method of claim 1, wherein the die comprises an edge and the electrical grounding path is formed through the edge.

9. The method of claim 8, wherein the guard ring is electrically connected to the edge by a plurality of metal fingers connected to and extending from the guard rings to the edge.

10. The method of claim 8, wherein the guard rings are electrically connected to the edge by a plurality of metal sheets comprising interspaced dielectric tiles.

11. The method of claim 10, wherein the metal sheets are interconnected by via connections.

12. The method of claim 9, wherein the metal fingers are interconnected by via connections.

13. The method of claim 1, wherein the bulk silicon is separated from the functional devices by an insulating layer.

14. The method of claim 1, wherein the die is built on a silicon on insulator (SOI) substrate.

15. A method of forming a semiconductor device comprising:

providing a semiconductor die having an edge surrounding the die, wherein the die includes bulk silicon and an area containing functional devices, wherein the area containing functional devices comprises metal and via layers, and wherein the bulk silicon is separated from the area containing functional devices by a layer of buried oxide;

providing a substrate electrically connected to the die through a plurality of electrical contacts; and forming an electrical ground path for the bulk silicon wherein the electrical ground path comprises conductive fillet material.

16. The method of claim 15, wherein the substrate comprises a ground pad and the conductive fillet material provides a connection from the bulk silicon to the ground pad.

17. The method of claim 15 further comprising:

providing guard rings, wherein the guard rings surround the area containing functional devices in the metal and via layers; and providing metal connectors that connect the guard rings to the edge of the die;

wherein the ground path provides a connection from the bulk silicon to the metal connectors.

18. The method of claim 17, wherein the metal connectors are metal fingers.

19. The method of claim 17, wherein the metal connectors are tiled metal sheets.

20. A method of forming a semiconductor device comprising:

providing a semiconductor die in a semiconductor substrate, wherein the die is produced by removing semiconductor substrate material surrounding the die to produce an exposed edge around the die;

wherein the die includes bulk silicon and an area containing functional devices, wherein the area containing functional devices comprises alternating metal and via layers, and wherein the bulk silicon is separated from the area containing functional devices by a layer of buried oxide;

and wherein the area containing functional devices is surrounded by guard rings in the metal and via layers proximate the edge and wherein the guard rings are connected to the edge by metal fingers or sheets that are exposed when the semiconductor material is removed;

providing a packaging substrate electrically connected to the die through a plurality of electrical contacts, wherein the packaging substrate comprises a ground pad; and forming an electrical ground path for the bulk silicon wherein the electrical ground path comprises conductive fillet material in context with said edge, and wherein the ground path connects the bulk silicon to the metal fingers or sheets exposed to the edge of the die and/or to the ground pad.

\* \* \* \* \*